United States Patent
Lee et al.

(10) Patent No.: US 7,532,510 B2
(45) Date of Patent: May 12, 2009

(54) FLASH MEMORY DEVICE WITH SECTOR ACCESS

(75) Inventors: Ho-Kil Lee, Gyeonggi-do (KR); Jin-Yub Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/428,816

(22) Filed: Jul. 5, 2006

(65) Prior Publication Data
US 2007/0133285 A1    Jun. 14, 2007

(30) Foreign Application Priority Data
Dec. 2, 2005    (KR)    ............ 10-2005-0116946

(51) Int. Cl.
*G11C 16/04* (2006.01)
*G11C 16/06* (2006.01)

(52) U.S. Cl. ............... 365/185.11; 365/185.12; 365/185.21; 365/185.33

(58) Field of Classification Search ............. 365/185.11
See application file for complete search history.

(56) References Cited

U.S. PATENT DOCUMENTS

| | | | |
|---|---|---|---|
| 5,689,470 A | | 11/1997 | Inoue |
| 5,768,215 A * | | 6/1998 | Kwon et al. ............ 365/238.5 |
| 6,067,274 A | | 5/2000 | Yoshimoto |
| 6,147,905 A | | 11/2000 | Seino |
| 6,278,636 B1 * | | 8/2001 | Lee ...................... 365/189.15 |
| 6,469,955 B1 * | | 10/2002 | Tsao et al. ............ 365/238.5 |
| 6,704,239 B2 * | | 3/2004 | Cho et al. ............. 365/230.04 |
| 6,717,857 B2 * | | 4/2004 | Byeon et al. .......... 365/185.21 |
| 7,154,784 B2 * | | 12/2006 | Lee ...................... 365/185.12 |
| 7,257,047 B2 * | | 8/2007 | Kim ..................... 365/230.04 |
| 7,379,333 B2 * | | 5/2008 | Lee et al. .............. 365/185.12 |
| 2002/0181315 A1 * | | 12/2002 | Lee et al. .............. 365/230.06 |
| 2003/0039142 A1 * | | 2/2003 | Tsao et al. ............ 365/185.12 |
| 2003/0043628 A1 * | | 3/2003 | Lee ...................... 365/185.17 |
| 2003/0063500 A1 | | 4/2003 | Naso et al. |
| 2005/0172086 A1 * | | 8/2005 | Kawai ....................... 711/154 |
| 2006/0203548 A1 * | | 9/2006 | You ...................... 365/185.12 |
| 2006/0227607 A1 * | | 10/2006 | Park et al. ............. 365/185.12 |

(Continued)

FOREIGN PATENT DOCUMENTS

JP    09-153293    6/1997

(Continued)

OTHER PUBLICATIONS

English language abstract of Korean Publication No. 1999-0045263.

(Continued)

*Primary Examiner*—Son L Mai
(74) *Attorney, Agent, or Firm*—Marger Johnson & McCollom, P.C.

(57) ABSTRACT

A flash memory includes memory cell array having memory cells divided into sectors, a page buffer block having groups of page buffers corresponding to the sectors, and a page buffer controller configured to control the groups of page buffers individually. In some embodiments, multiple groups of page buffers may be activated simultaneously to access multiple sectors, while page buffer groups for unselected sectors are deactivated.

24 Claims, 6 Drawing Sheets

U.S. PATENT DOCUMENTS

2007/0136563 A1* 6/2007 Park et al. .................. 712/220

FOREIGN PATENT DOCUMENTS

| JP | 11-149787 | 6/1999 |
|---|---|---|
| JP | 2000-048586 | 2/2000 |
| KR | 1999-0045263 | 6/1999 |

OTHER PUBLICATIONS

English language abstract of Japanese Publication No. 09-153293.
English language abstract of Japanese Publication No. 11-149787.
English language abstract of Japanese Publication No. 2000-048586.

* cited by examiner

US 7,532,510 B2

FLASH MEMORY DEVICE WITH SECTOR ACCESS

CROSS-REFERENCE TO RELATED APPLICATIONS

This application claims priority from Korean Patent Application No. 2005-116946, filed on Dec. 2, 2005, the entire contents of which are hereby incorporated by reference.

BACKGROUND

Semiconductor memory devices are usually characterized as either volatile or non-volatile devices. In volatile memory devices, logic information is stored either by setting up the logic state of a bistable flip-flop, such as in a static random access memory, or through the charging of a capacitor as in a dynamic random access memory. In volatile memory devices, the data is lost whenever there is a power interruption; hence, the name volatile memories.

Non-volatile semiconductor memory devices such as mask read-only memory (MROM), programmable read-only memory (PROM), erasable read-only memory (EPROM), electrically erasable read-only memory (EEPROM), etc. are capable of storing data even during a power interruption. The nonvolatile memory data storage mode may be permanent or reprogrammable, depending upon the fabrication technology used. Nonvolatile memories may be used for program and microcode storage in a wide variety of applications in various industries, including the computer, avionics, telecommunications, and consumer electronics industries. A combination of single-chip volatile as well as nonvolatile memory storage modes is also available in devices such as nonvolatile SRAM (nvRAM) for systems that require fast, reprogrammable non-volatile memories. In addition, numerous special memory architectures have evolved which contain some additional logic circuitry to optimize their performance for application-specific tasks.

In some nonvolatile semiconductor memory devices like MROM, PROM and EPROM, due to problems associated with electrical erasing and writing, it is not easy for general users to update the stored contents. On the other hand, since electrical erasing and writing for EEPROM can be readily accomplished, it is widely used in applications that need continuous updating. A flash EEPROM (hereinafter, referred to as a flash memory) has a higher integrity degree than a conventional EEPROM. Flash EEPROM is suitable for a large volume auxiliary storage device. Among flash memories, a NAND flash memory has a higher integrity degree as compared to a NOR flash memory. Generally, a NAND flash memory is used to store a large volume of data, and a NOR flash memory is used to store code data such as boot code.

With an increase in the use of flash memories, issues like operating time and power consumption of flash memories become critical design factors.

SUMMARY

Some of the inventive principles of this patent disclosure relate to a flash memory device comprising a memory cell array with a plurality of memory cells divided into a plurality of sectors, a page buffer block having groups of page buffers corresponding to the sectors of the memory cell array, and a page buffer controller configured to control the groups of page buffers individually so that a read operation may be performed on a sector basis. In one embodiment, page buffers corresponding to the sectors being read may be activated during a part of the read operation. In another embodiment, the read operation may include a bit line discharge period, a bit line precharge period, a bit line develop period, and a sense period. In some embodiments, during the bit line precharge period and the sense period, the page buffer controller may activate groups of page buffers corresponding to selected sectors and deactivate groups of page buffers corresponding to unselected sectors.

Some additional inventive principles of this patent disclosure relate to a NOR-NAND flash memory device comprising a memory cell array divided into a plurality of sectors, a page buffer block having plural groups of page buffers corresponding to the sectors of the memory cell array, a register block configured to store command and sector information for a read operation, control logic configured to generate a read enable signal in response to the command information; and a page buffer controller operative in response to the read enable signal and configured to control the page buffer block according to the sector information, wherein the page buffer controller individually controls the groups of page buffers so that data is read out only from sectors identified by the sector information.

Some other inventive principles of this patent disclosure relate to a method of reading a flash memory device by activating a page buffer group coupled to a selected sector of a memory cell array, deactivating page buffer groups coupled to any unselected sectors of the memory cell array, and reading data from the selected sector. In one embodiment, page buffer groups coupled to two or more selected sector may be activated simultaneously.

DETAILED DESCRIPTION

Preferred embodiments of the invention will be described below in more detail with reference to the accompanying drawings. The inventive principles may, however, be embodied in different forms and should not be constructed as limited to the embodiments set forth herein. Rather, these embodiments are provided so that this disclosure will be thorough and complete, and will fully convey the scope of the invention to those skilled in the art.

Figure 1:
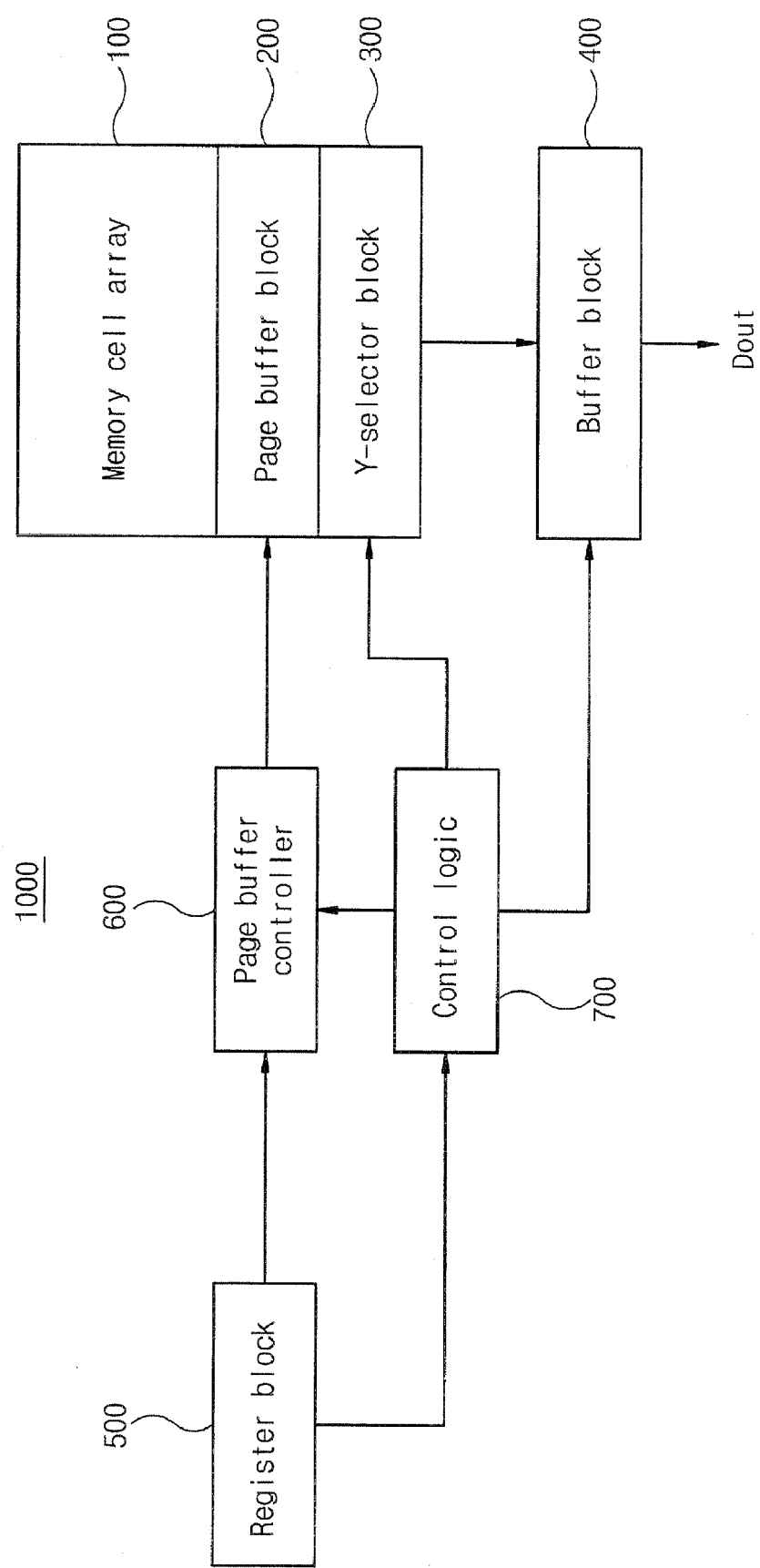
FIG. 1 is a block diagram illustrating an embodiment of a flash memory device according to the inventive principles of this patent disclosure.

FIG. 1 is a block diagram illustrating an embodiment of a flash memory device 1000 in accordance with the inventive principles of this patent disclosure. The flash memory device 1000 may be any suitable memory device, for example a NAND flash memory device, a NOR flash memory device, or a NOR-NAND type flash memory device. A NOR-NAND flash memory employs a NAND-type memory cell array with a NOR-type interface to retain the benefits of NAND memory while providing the higher access speeds of NOR-type flash memory. An example of such a hybrid NOR-NAND device is Samsung's OneNAND® brand flash memory. However, the inventive principles of this patent disclosure are not limited to the above mentioned memory devices and may be applied to any appropriate device.

Referring to FIG. 1, the flash memory device 1000 includes a memory cell array 100, a page buffer block 200, a column selector block 300, a buffer block 400, a register block 500, a page buffer controller 600, and control logic 700.

The memory cell array 100, although not illustrated in the figure, includes memory cells arranged in rows and columns. Each of the memory cells may consist of a floating gate transistor. An exemplary array structure is disclosed in U.S. Pat. No. 6,278,636 entitled "NONVOLATILE SEMICONDUCTOR MEMORY DEVICE HAVING IMPROVED PAGE BUFFERS", which is incorporated by reference. The memory cell array 100 may be divided into a plurality of memory blocks. One row (or one page) may have one or more (for example, four) sectors. Each sector may comprise a plurality (for example, 512) of memory cells (excepting redundant cells). Each memory cell may store N-bit data, where N can be 1 or a higher integer. The page buffer block 200 can read and store data from the memory cell array 100 and is controlled by the page buffer controller 600. Data thus read is page data and includes data read from one or more of the sectors constituting a page. The page buffer block 200 has page buffers that correspond to columns of the memory cell array 100. If one row of the memory cell array 100 consists of one page, the number of page buffers corresponds to the number of columns (or bit lines) in the memory cell array 100. If one row of the memory cell array 100 consists of two pages, the number of page buffers corresponds to half the number of columns (or bit lines). However, the inventive principles are not limited to any specific relationship between the number of page buffers and the number of columns.

The column selector block 300 is controlled by the control logic 700 and selects page buffers in the page buffer block 200 according to column address information from the register block 500. The column selector block 300 outputs data bits from selected page buffers to the buffer block 400. The buffer block 400 temporarily stores data bits transferred through the column selector block 300. When a page of data stored in the page buffer block 200 is received, the buffer block 400 outputs the stored data (Dout) to an external agent (for example, the host) and is controlled by the control logic 700. The buffer block 400 may also temporarily store data (provided by an external agent, for example, the host) to be programmed in the memory cell array 100. Stored data in the buffer block 400 may be transferred to the page buffer block 200 via the column selector block 300.

The register block 500 is configured to store address and command information provided from an external agent (for example, the host). Address information stored in the register block 500 may include a sector address, sector number information, a page address, and so forth. Command information stored in the register block 500 may include a read command, a program command, an erase command, and so forth. The sector address indicates the sector selected from the memory cell array 100. The selector number information indicates whether any additional sectors are simultaneously selected during a read operation. Selected sectors are identified by the sector information (including sector address and sector number information). The page buffer controller 600 is controlled by the control logic 700, and controls the page buffer block 200 in response to the sector information from the register block 500.

For example, during a read operation, the page buffer controller 600 receives sector address and sector number information and controls page buffers in the page buffer block 200 on a sector basis. While reading data corresponding to one sector, the page buffer controller 600 controls the page buffer block 200 so that page buffers of the selected sector carry out a read operation (for example, bit line precharge and latch operation), which will be described in more detail below. The control logic 700 may be configured to control the overall operation of the flash memory device 1000. For example, the control logic 700 may control all operations of the flash memory device 1000 based on whether command information stored in the register block 500 indicates a read, program or erase command. The control logic 700, for example, may include a state machine.

Figure 2:
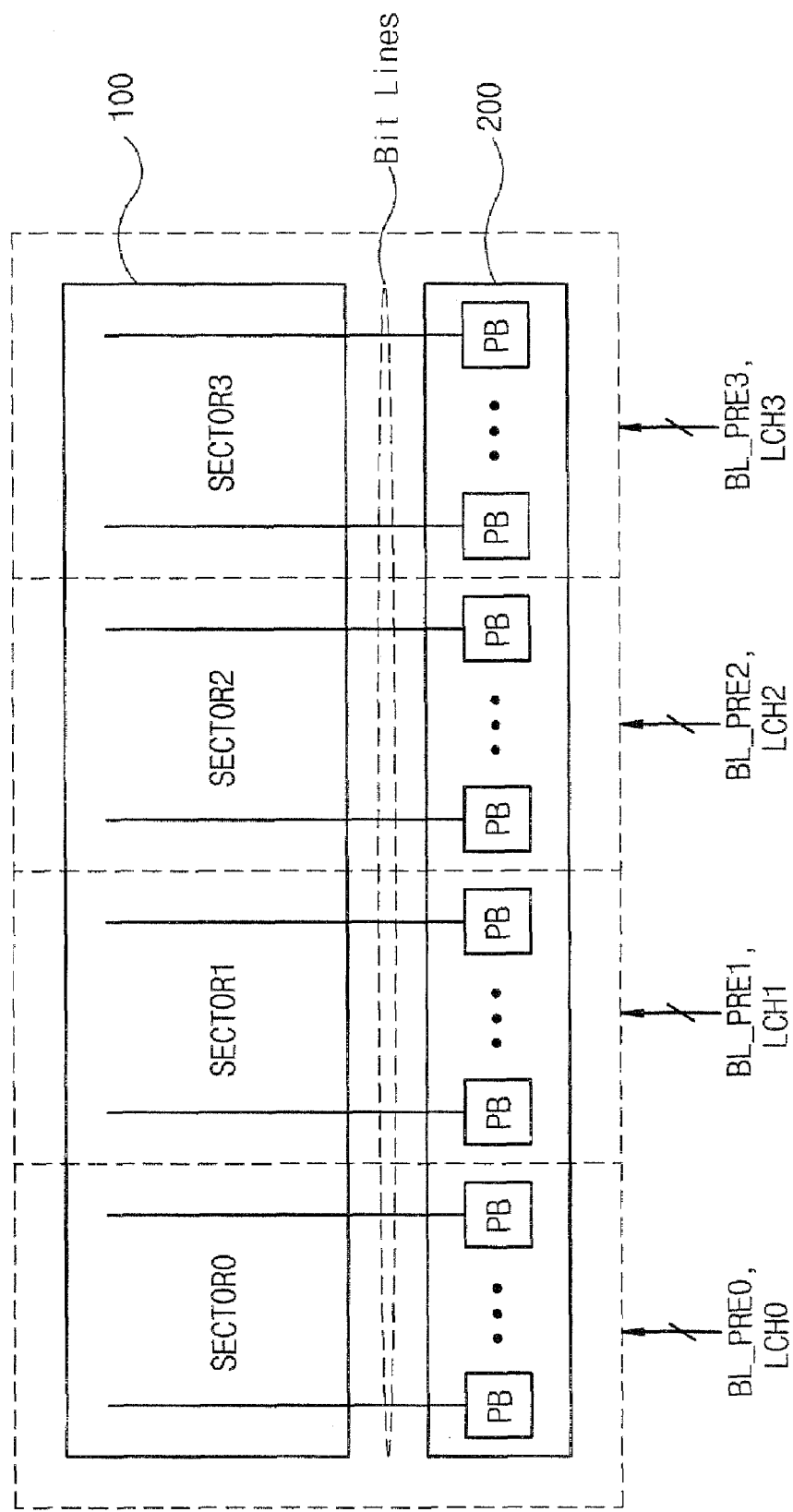
FIG. 2 is a block diagram illustrating an example embodiment of a memory cell array and a page buffer block according to the inventive principles of this patent disclosure.
Figure 3:
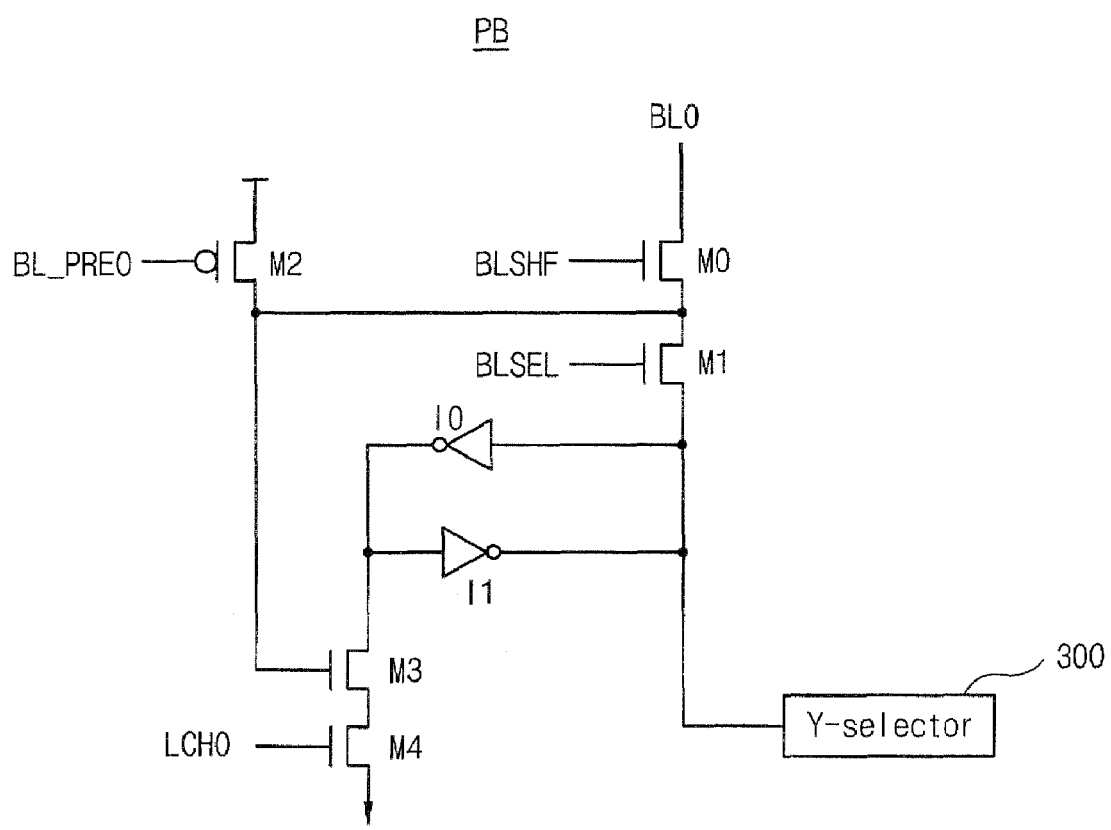
FIG. 3 illustrates an example embodiment of a page buffer according to the inventive principles of this patent disclosure.

FIG. 2 is a block diagram illustrating embodiments of the memory cell array and page buffer block of FIG. 1 according to the inventive principles of this patent disclosure. FIG. 3 illustrates an example embodiment of the page buffer of FIG. 2.

Referring to FIG. 2, a memory cell array 100 is divided into a plurality of sectors, for example, four sectors SECTOR0, SECTOR1, SECTOR2, and SECTOR3, each of which includes a plurality of columns (or bit lines). A page buffer block 200 includes a plurality of page buffers PB connected to the columns (or bit lines) of the memory cell array 100. However, the inventive principles of this patent disclosure are not limited to any particular number of sectors, bit lines, page buffers and the configuration of the page buffers shown in FIG. 2. Similarly, the example page buffer illustrated in FIG. 3 has a structure for programming and reading 1-bit data; however, the inventive principles of this disclosure may be applied to programming and reading multi-bit data.

The page buffers PB in FIG. 2 are controlled in sector units through a page buffer controller 600 as illustrated in FIG. 1. For example, page buffers PB belonging to a sector SECTOR0 perform their read operations in response to control signals BL_PRE0 and LCH0 from the page buffer controller 600. Likewise, the page buffers coupled to sectors SECTOR1, SECTOR2 and SECTOR3 perform their read operations in response to control signals BL_PRE1 and LCH1, BL_PRE2 and L2, and BL_PRE3 and LCH3, respectively, from the page buffer controller 600. The control signals BL_PRE0 through BL_PRE3 are precharge control signals that are activated when the bit lines in each sector are precharged, and may be applied to the gates of PMOS transistors M2 of the page buffers of the corresponding sector, as illustrated in FIG. 3. The control signals LCH0 through LCH3 are latch control signals that are activated when data on the bit lines in each sector is latched, and may be applied to the gates of PMOS transistors M4 of the page buffers of the corresponding sector, as illustrated in FIG. 3. The control signals BL_PREi and LCHi (i=0 to 3) may be activated by the page buffer controller 600 based on sector address and sector number information stored in the register block 500. In FIG. 3, control signals BLSHF and BLSEL are provided from the page buffer controller 60. The control signal BLSHF may be activated during the bit line precharge and sense periods of a read operation.

Figure 4:
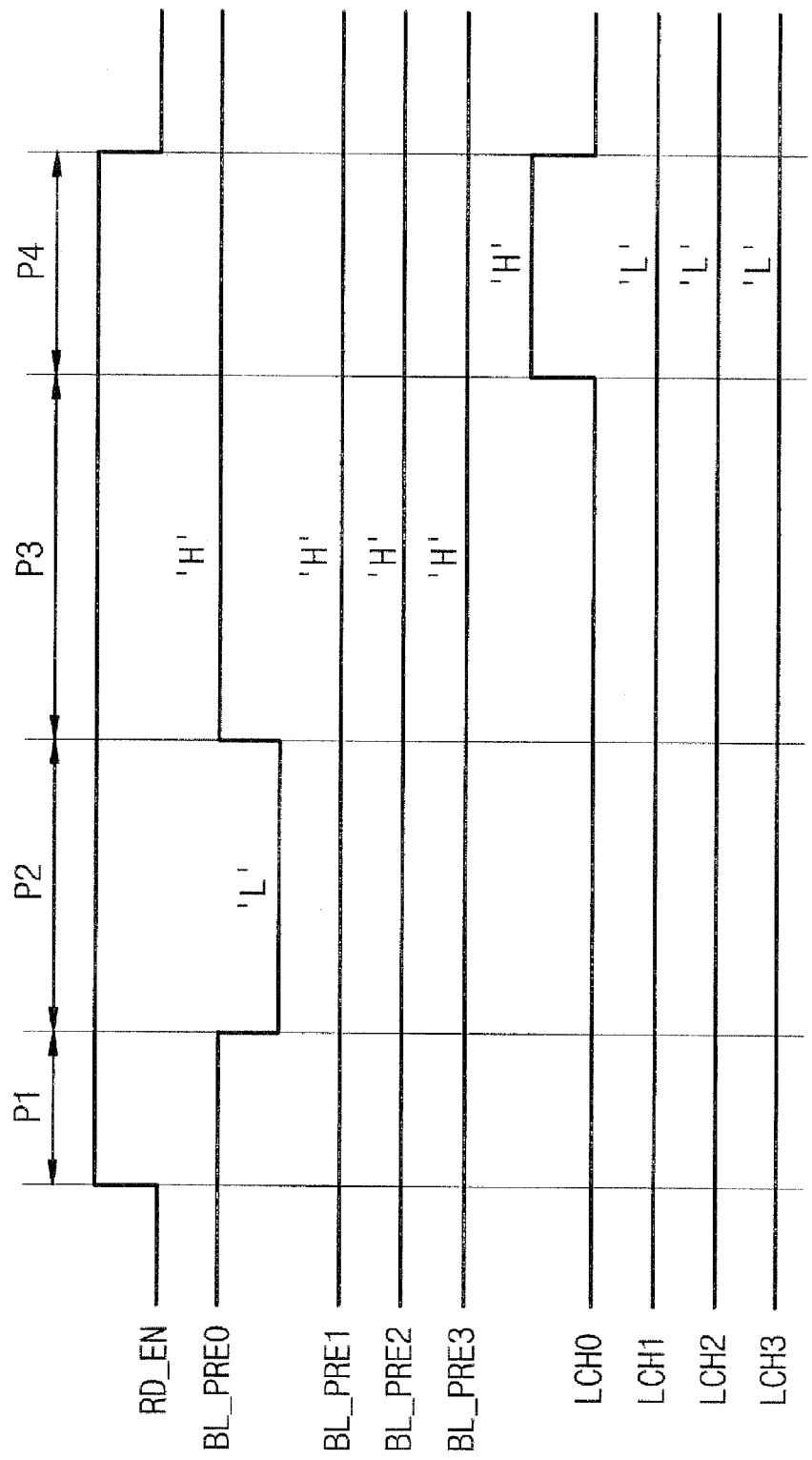
FIGS. 4 to 6 are timing diagrams illustrating example embodiments of read operations of a flash memory device according to the inventive principles of this patent disclosure.

FIG. 4 is a timing diagram illustrating an embodiment of a read operation for one sector of a flash memory device shown in FIGS. 1-3, according to the inventive principles of this patent disclosure. FIG. 4 shows the relationship between control signals BL_PREi and LCHi when reading data from the $i^{th}$ sector (where i can be 0, 1, 2 or 3). FIG. 4 specifically illustrates data being read from SECTOR0, however, the inventive principles can be applied to read data from any other sector as well. In FIG. 4, periods P1 to P4 indicate a bit line discharge period, a bit line precharge period, a bit line develop period, and a sense period, respectively.

While reading from a memory cell array 100, a read command and address information are stored in a register block 500 by a host (not shown). The address information stored in the register block 500 may include a page address, a sector address, sector number information, and so on. Once the read command and the address information are stored in the register block 500, control logic 700 activates a read enable signal RD_EN by driving it high in response to the stored read command in the register block 500. The read enable signal RD_EN is maintained in the active (high) state until the read operation is completed. A page buffer controller 600 operates responsive to the read enable signal RD_EN and controls page buffers PB according to a sector address and a sector number from the register block 500. This will be more fully described below.

First, during the bit line discharge period P1, the page buffer controller 600 controls the page buffer block 200 so that the bit lines of the memory cell array 100 are discharged to a ground voltage. Although not shown in the figures, a discharge circuit for discharging the bit lines is provided in the page buffer block 200. During the bit line precharge period P2, the page buffer controller 600 selectively activates control signals BL_PRE0 through BL_PRE3 based on the sector address and the sector number information from the register block 500. When reading out data from SECTOR0, the page buffer controller 600 activates (drives low) the control signal BL_PRE0, which is applied to the group of page buffers PB corresponding to sector SECTOR0 (see FIG. 2). This enables the bit lines of sector SECTOR0 to be precharged with current supplied from PMOS transistors M2 in the page buffers PB. During this period, control signals BL_PRE1 through BL_PRE3 corresponding to the remaining sectors SECTOR1 through SECTOR3 are inactive (high). When the precharge operation on the bit lines of sector SECTOR0 is complete (end of period P2), the control signal BL_PRE0 is deactivated (driven high) by the page buffer controller 600.

During the bit line develop period P3, a bit line may be maintained at a precharged voltage or lowered toward a ground voltage depending on whether the attached memory cell is a programmed cell or an erased cell. For example, if the memory cell is programmed, the corresponding bit line is maintained at a precharged voltage. On the other hand, if the memory cell is erased, the corresponding bit line is lowered toward a ground voltage. After a bit line develop operation is carried out, the page buffer controller 600 controls the page buffer block 200 so as to latch voltages of bit lines of the selected sector SECTOR0 during the sense period P4. The page buffer controller 600 activates (drives high) a control signal LCH0 during the sense period P4, with the control signal BLSHF being in an active state. During this time, the remaining control signals LCH1 to LCH3 are inactive (low), thus turning off NMOS transistors M4 in the page buffers PB corresponding to the remaining sectors SECTOR1 to SECTOR3.

Figure 5:
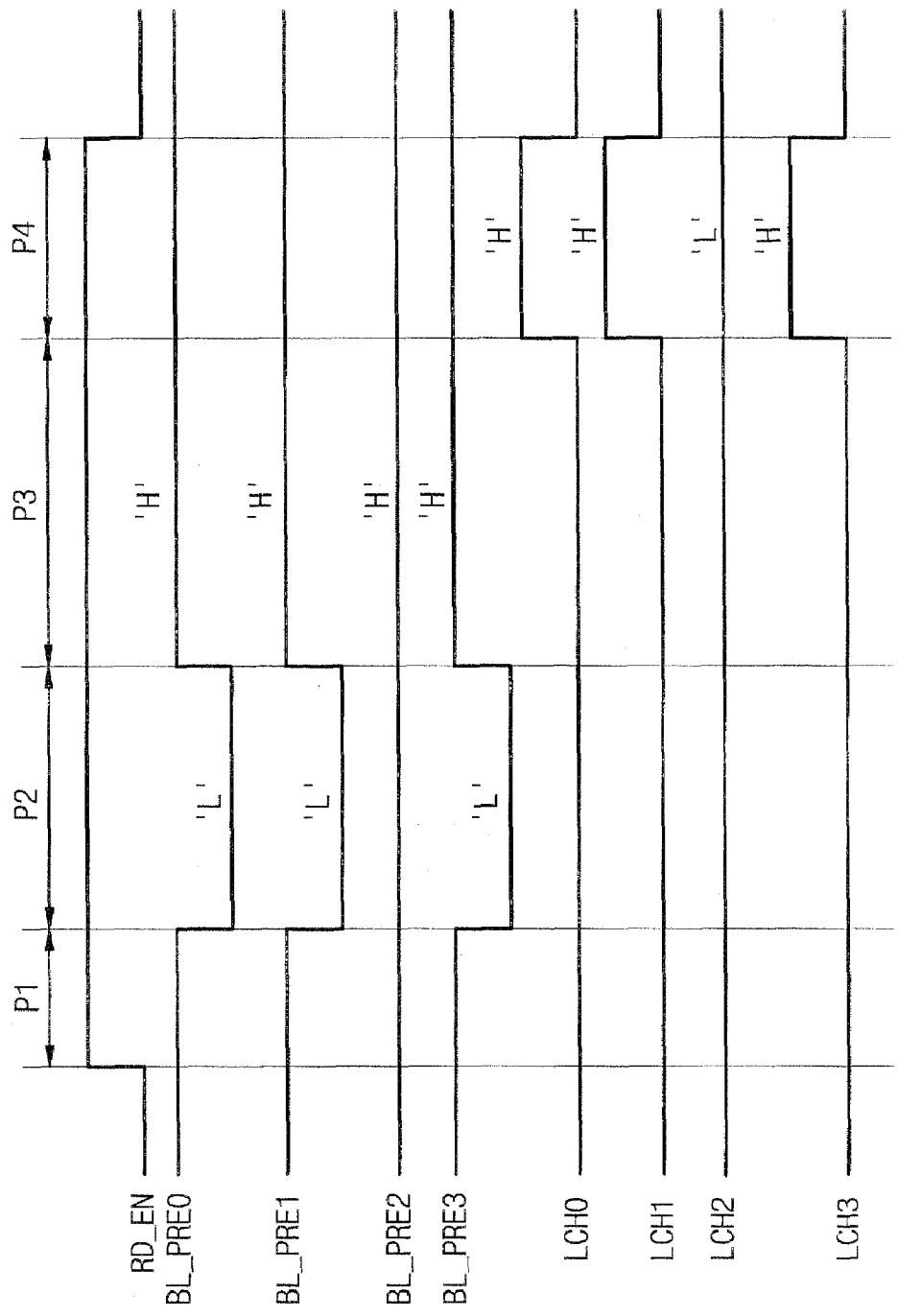

If a memory cell in the selected sector (SECTOR0) is programmed, the NMOS transistor M3 is turned on because the voltage of the bit line is higher than the threshold voltage of the NMOS transistor M3 in the page buffer. This sets the value of the latch (consisting of invertors I0 and I1) to logic '0'. On the other hand, if the memory cell is erased, the NMOS transistor M3 is turned off because the voltage of a bit line is lower than the threshold voltage of the NMOS transistor M3 in the page buffer. This sets the value of the latch (consisting of invertors I0 and I1) to logic '1'. Afterward, data read from memory cells of the selected sector SECTOR0 is sequentially transferred through a column selector block 300 to a buffer block 400 in a given unit. FIG. 5 illustrates a timing diagram for simultaneously reading data from three sectors of the flash device described in FIGS. 1-3. FIG. 5 illustrates reading data from SECTOR0, SECTOR1 and SECTOR3; however, data can be read from any three sectors. The control signals BL_PRE0, BL_PRE1, and BL_PRE3 are simultaneously activated during a bit line precharge period, and control signals LCH0, LCH1, and LCH3 are simultaneously activated during a sense period. Except for these differences, the read operation as shown in FIG. 5 is similar to that illustrated in FIG. 4, and description thereof is thus omitted.

Figure 6:
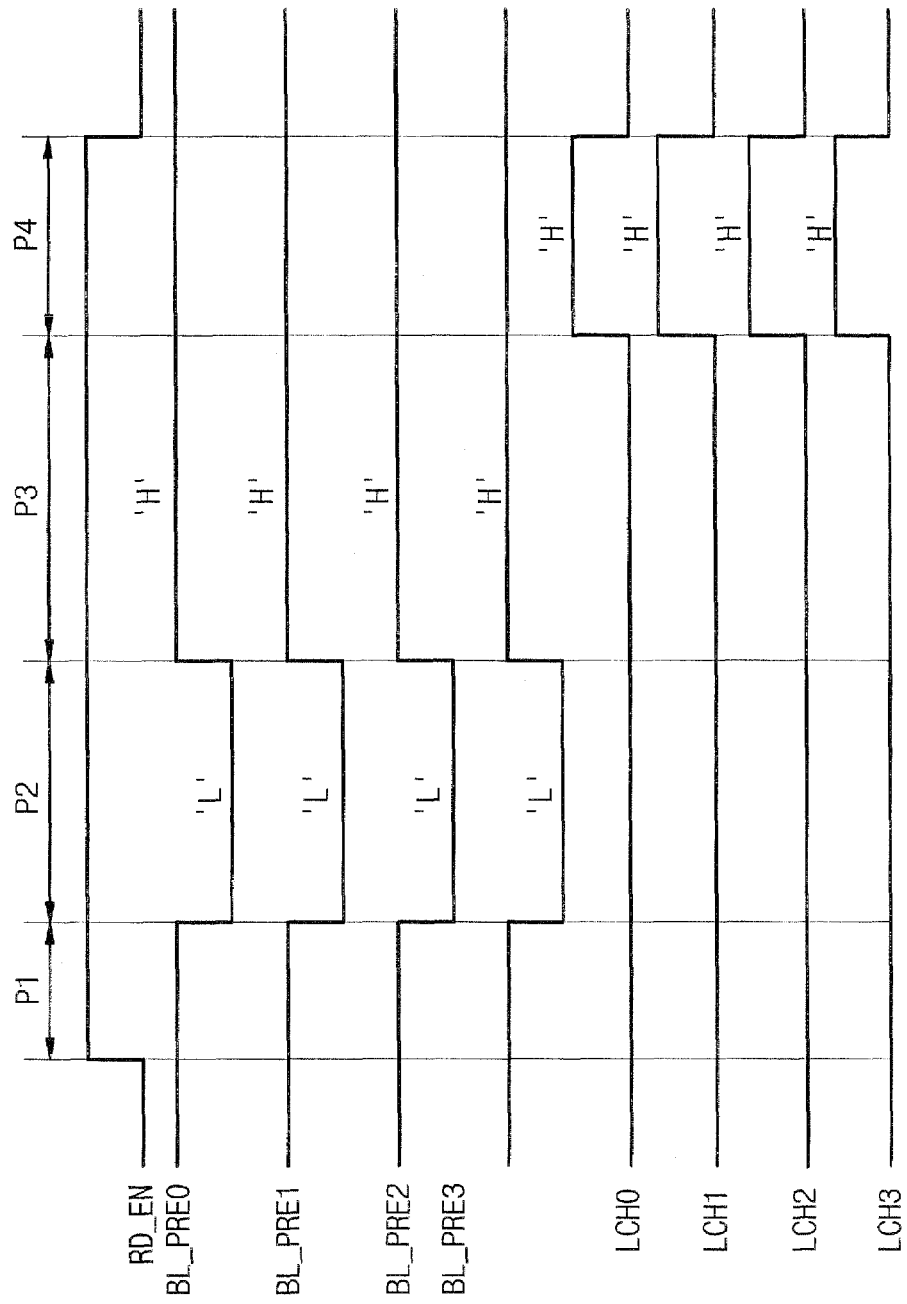

FIG. 6 illustrates a timing diagram for reading data from all of the sectors (SECTOR0-SECTOR3) in a page. The control signals BL_PRE0, BL_PRE1, BL_PRE2, and BL_PRE3 are simultaneously activated during a bit line precharge period, and control signals LCH0, LCH1, LCH2, and LCH3 are simultaneously activated during a sense period. Except for this difference, the read operation shown in FIG. 6 is similar to that illustrated in FIG. 4, and description thereof is thus omitted.

As understood from the above description, it may be possible to reduce power consumption by controlling a page buffer block in a sector unit based on the amount of data to be read during a read operation.

A flash memory device 1000 according to the present invention may be utilized in various applications. For example, application areas may include a storage medium for MP3 players, digital cameras, memory cards, auxiliary storage of a computer system, etc.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

The invention claimed is:

1. A flash memory device comprising:
a memory cell array having memory cells arranged in rows and columns and divided into sectors;
a page buffer block having groups of page buffers corresponding to the sectors of the memory cell array; and
a page buffer controller configured to control the groups of page buffers individually in response to sector information;
wherein the page buffer controller is able to activate all of the groups of page buffers simultaneously.

2. The flash memory device according to claim 1, wherein each sector is read individually if only one sector is to be read.

3. The flash memory device according to claim 1, wherein two or more sectors are read simultaneously if two or more sectors are to be read.

4. The flash memory device according to claim 3, wherein the page buffers corresponding to the sectors being read are activated during a read operation.

5. The flash memory device according to claim 1, wherein a read operation comprises a bit line discharge period, a bit line precharge period, a bit line develop period, and a single sense period.

6. The flash memory device according to claim 5, wherein during the bit line precharge period and the single sense period, the page buffer controller activates all groups of page buffers corresponding to sectors being read during the read operation and deactivates groups of page buffers corresponding to sectors not being read during the read operation.

7. The flash memory device according to claim 6, wherein during the bit line precharge period, page buffers corresponding to the activated groups are configured to precharge columns of corresponding sectors in response to the page buffer controller.

8. The flash memory device according to claim 6, wherein during the sense period, page buffers of the activated groups are configured to latch voltages of columns of corresponding sectors according to a control of the page buffer controller.

9. The flash memory device according to claim 1, further comprising a register block configured to store sector information for selecting sectors during a read operation.

10. The flash memory device according to claim 9, wherein the sector information comprises a sector address and sector number information.

11. A flash memory device comprising:
a memory cell array having memory cells arranged in rows and columns and divided into sectors;
a page buffer block having groups of page buffers corresponding to the sectors of the memory cell array;
a page buffer controller configured to control the groups of page buffers individually; and
a register block configured to store sector information for selecting sectors during a read operation;
wherein the sector information comprises a sector address and sector number information; and
wherein the page buffer controller controls the bit line precharge and sense operations of the page buffer block based on the stored sector information in the register block, during the read operation.

12. The flash memory device according to claim 1, wherein the flash memory device is used as a storage medium for a memory card.

13. A flash memory device comprising:
a memory cell array having memory cells arranged in rows and columns and divided into a plurality of sectors;
a page buffer block having plural groups of page buffers corresponding to the sectors of the memory cell array;
a register block configured to store command and sector information for a read operation;
control logic configured to generate a read enable signal in response to the command information; and
a page buffer controller operative in response to the read enable signal and configured to control the page buffer block according to the sector information;
wherein the page buffer controller individually controls the groups of page buffers so that data is only read out from sectors identified by the sector information; and
wherein the page buffer controller is able to activate all of the groups of page buffers simultaneously.

14. The flash memory device according to claim 13, wherein the read operation comprises a bit line discharge period, a bit line precharge period, a bit line develop period, and a single sense period.

15. The flash memory device according to claim 14, wherein during the bit line precharge period and the single sense period, the page buffer controller activates groups of page buffers corresponding to sectors identified by the sector information and deactivates groups of page buffers corresponding to unselected sectors.

16. The flash memory device according to claim 15, wherein during the bit line precharge period, page buffers of the activated groups are configured to precharge columns of corresponding sectors in response to the page buffer controller.

17. The flash memory device according to claim 15, wherein during the sense period, page buffers of the activated groups are configured to latch voltages of columns of corresponding sectors in response to the page buffer controller.

18. The flash memory device according to claim 13, wherein the sector information comprises a sector address and sector number information.

19. A flash memory device comprising:
a memory cell array having memory cells arranged in rows and columns and divided into a plurality of sectors;
a page buffer block having plural groups of page buffers corresponding to the sectors of the memory cell array;
a register block configured to store command and sector information for a read operation;
control logic configured to generate a read enable signal in response to the command information; and
a page buffer controller operative in response to the read enable signal and configured to control the page buffer block according to the sector information;
wherein the page buffer controller individually controls the groups of page buffers so that data is only read out from sectors identified by the sector information; and
wherein the page buffer controller controls the bit line precharge and sense operations of the page buffer block based on the stored sector information in the register block during the read operation.

20. A method for reading a flash memory device, the method comprising:
activating first page buffer groups coupled to selected sectors of a memory cell array individually in response to sector information;
deactivating second page buffer groups coupled to any unselected sectors of the memory cell array individually; and
reading data from the selected sectors;
wherein all sectors of the memory cell array are able to be selected simultaneously.

21. The method according to claim 20, further comprising activating a two or more page buffer groups coupled to selected sectors of a memory cell array.

22. The method according to claim 21 wherein the page buffer groups coupled to the selected sectors are activated simultaneously.

23. The flash memory device according to claim 1, wherein the page buffer controller is configured to control the groups of page buffers individually based on an amount of data to be read during a read operation in response to information provided from an external agent; and wherein less than a whole page of data may be read during a complete read operation.

24. The method according to claim 20, wherein:
the page buffer group coupled to the selected sector of the memory cell array is activated based on an amount of data to be read during a read operation in response to information provided from an external agent; and
the page buffer groups coupled to any unselected sectors of the memory cell array are deactivated based on the amount of data to be read during the read operation in response to the information provided from the external agent.

* * * * *

UNITED STATES PATENT AND TRADEMARK OFFICE
CERTIFICATE OF CORRECTION

PATENT NO. : 7,532,510 B2  
APPLICATION NO. : 11/428816  
DATED : May 12, 2009  
INVENTOR(S) : Ho-Kil Lee et al.

Page 1 of 1

It is certified that error appears in the above-identified patent and that said Letters Patent is hereby corrected as shown below:

Column 4, line 39, the word "L2" should read -- LCH2 --.

Signed and Sealed this

Fifteenth Day of September, 2009

David J. Kappos
*Director of the United States Patent and Trademark Office*